United States Patent [19]

Lomashevitch

[11] Patent Number: 5,446,579
[45] Date of Patent: Aug. 29, 1995

[54] OPTICAL PROCESSOR

[75] Inventor: Svjatoslav A. Lomashevitch, Sankt-Peterburg, Russian Federation

[73] Assignee: Samsung Electronics Co., Ltd., Suwon, Rep. of Korea

[21] Appl. No.: 194,666

[22] Filed: Feb. 14, 1994

[30] Foreign Application Priority Data

Feb. 12, 1993 [RU] Russian Federation ........... 93008436

[51] Int. Cl.⁶ ............................................ H01L 31/12
[52] U.S. Cl. ...................................... 359/333; 359/107
[58] Field of Search ................ 359/332, 333, 344, 346, 359/107; 372/8, 94; 385/15, 130

[56] References Cited

U.S. PATENT DOCUMENTS 5,001,523  3/1991  Lomashevich et al. .

OTHER PUBLICATIONS

Lomashevich, S. A., Bystrov, Yu L. "Concept of Optical Transistor", Journal of Applied Spectroscopy 1991, t.55, No. 3, pp. 485–490.
Marcatili, E. A. J., "Bends in Optical Dielectric Guides", The Bell System Technical Journal—1969—vol. 48, No. 7, pp. 2103–2132.
Papuchon, M., Roy Ann, Ostrowski, D., "Electrically Active Optical Bifurcation", Appl. Phys. Lett., 1977, vol. 31, No. 4, pp. 266–267.
Tooley, F. A. P., Smith, S. D., Seaton, C. T., "High Gain Signal Amplification in an InSb Transfasor at 77K", Appl. Phys. Lett.—1983—vol. 43, No. 9, pp. 807–809.

Primary Examiner—Mark Hellner
Attorney, Agent, or Firm—Cushman, Darby & Cushman

[57] ABSTRACT

An optical processor includes a non-linear ring resonator with lasers and two waveguides with electrodes positioned above them. This optical processor extends its functional range, i.e. providing multi-level processing of optical signals, an increase of power responsivity of input signals, increasing the number of optical contacts. In this optical processor, semiconductor lasers have been provided on the coupling waveguides. Optical mode mixers in coupling regions have been generated by connecting the waveguides and the ring resonator in coupling regions so that the following relationship is observed: an one-mode waveguide and a ring resonator make up a two-mode mixer, and electrodes are applied above the coupling regions.

5 Claims, 10 Drawing Sheets

FIRST OPTICAL IMPULSE

OPTICAL PROCESSOR

BACKGROUND OF THE INVENTION

The present invention relates to optical processors and, more particularly, to an optical processor for processing optical energy in optical logical devices and optical devices for the amplification, commutation, switching, and computing of optical signals. The present invention is particularly advantageous in applications involving optical waveguide communication, data transmission systems, and computer circuits including arithmetic/logic units.

A known optical processor device, termed the "transphasor", is based upon the non-linear Fabry-Perot interferometer (FPI). As described in Tooley F. A. P., Smith S. D., Seaton C. T. "*High Gain Signal Amplification in an InSb Transfasor at 77K*" *Appl. Phys. Lett.*, vol. 43, No. 9, pp. 807–809, November 1983, the Fabry-Perot interferometer utilized by Tooley et al. is an optical non-linear phase modulator using semiconductor InSb (indium/antimony) material with the resonant cavity bounded by mirrors. Using the known optical non-linearity of the InSb material, a "light-by-light" amplification effect was obtained by introducing a powerful pumping beam and a weak data-carrying beam into the InSb semiconductor crystal. As a result, modulation of one beam by the other and amplification of the data-carrying optical signal (OS) up to 40 dB was obtained. The transphasor has the advantages of small size (200 μm in diameter and 600 μm in length), a high non-linearity factor, and high amplification. The drawbacks of the transphasor include the need for an external or outer pumping source, a single input and a single channel, complicated input/output beams due to the structural peculiarities of the device, and the necessity for complete frequency coincidence of the Fabry-Perot interferometer and the input optical signal. Because of these drawbacks, the use of the transfasor is limited by laboratory conditions.

The optical device disclosed in U.S. Pat. No. 5,001,523 issued on Mar. 19, 1991 to Lomashevich S., Bystrov J., and Semenova, G. and entitled "*Optical Transistor*" is closest in its technical nature to the present invention; the disclosure of U.S. Pat. No. 5,001,523 is incorporated herein by reference. The optical transistor disclosed in U.S. Pat. No. 5,001,523 allows the commutation and amplification of optical signals as well as the selection of different-frequency radiations by channels. The optical transistor advantageously possess a high amplification factor, the potential for commutation or switching of the optical signals, a small size, and a high Q-factor for the ring resonator (RR). The drawbacks include limited channel accessibility, a low sensitivity level for the input channels, and the lack of a multi-level system for the processing of optical signals, i.e., a lack of storage and logic capability. Additional disclosure as to the characteristics of ring resonators of the type utilized in the optical transistor disclosed in U.S. Pat. No. 5,001,523 can be found in Marcatili E. A. J., "*Bends in Optical Dielectric Guides*" The Bell System Technical Journal, 1969, vol. 48, No. 7, pp. 2103–2132 and Woller L., "*Important Components of Optical Logical Circuits*" Elecktronika, 1982, No. 26, pp. 3–4.

SUMMARY OF THE INVENTION

In view of the above, it is an object of the present invention, among others, to provide an active optical processor that is controllable by input optical signals, fully accessible, possesses an increased number of optical ports or contacts for inputting or outputting optical energy, a device having a high input signal sensitivity level, high-power output signals, and the ability to carry out multi-level processing of optical signals as well as computing operations and storage functions.

To achieve these objects, and others, the present invention introduces semiconductor lasers into the coupling waveguides to thereby create or generate optical mode mixers in the coupling regions by way of connecting the waveguides and the ring resonator in the coupling regions so that the one-mode waveguides and the ring resonator originate or define two-mode mixers with control electrodes applied over the coupling regions.

In accordance with the present invention, a preferred embodiment includes a nonlinear ring resonator and at least one pair of strip waveguides on a common substrate, each of the waveguides having a region of optical coupling with the nonlinear ring resonator and each of the waveguides having a semiconductor laser at opposite end portions thereof, at least a first and a second semiconductor laser positioned in the nonlinear ring resonator in regions thereof outside of the regions of optical coupling, and control electrodes located at the regions of optical coupling and located on the ring resonator intermediate the first and second semiconductor lasers and the regions of optical coupling.

The present invention provides a unified optical system through the functional unification or intergration of the optical transistor and the electrically active optical bifurcation coupling of the laser-containing waveguides and the ring resonator. The introduction of semiconductor lasers into the coupling regions, that is, the generation of a "direct" optical transistor (OT) with a phase modulator (Ph.M) between the lasers in the region of coupling with the ring resonator effectively creates or generates mixers of the electrically active optical bifurcation (BOA) type that provide a number of new functions and benefits. (Electrically active optical bifurcation is described in more detail in Papuchon M., Roy, Am., Ostrowsky D., "*Electrically Active Optical Bifurcation*" *Appl. Phys. Lett.*, Vol. 31, No. 4. pp. 266–267, August 1977).

The present invention allows the implementation of the multi-level processing of optical signals due to the multistability effect that is peculiar to the BOA/ring optical transistor structure. Optical signals can be input through any of the optical contacts or ports and the output radiation can be picked-off from any of the output channels as determined by the direction or way of the propagation of the radiation in the input optical transistor and the electrically active optical bifurcation coupling structure. The present invention allows the use of a single integrated or unified optical device to successively carry out optical signal processing, including amplification, storage, re-radiation of the amplified signal at any frequency, as specified by the input optical transistor, switching, and commutation. These functional capabilities are conditioned by and a function of the several cascades of optical signal processing that can be generated in the device: the first (input) optical transistor effects amplification; multi-level memory, generated by combining the electrically active optical bifurcation coupling and ring optical transistor, effects storage; and re-radiation of the optical signal at any frequency is effected by the second, output optical transistor with adjustment frequency of the C³-laser, generated by two beams introduced into the coupling waveguide. The present invention also allows the processing of low-power optical signals, having a low-power on the order of the magnitude of the noise level, which processing is possible due to the "preliminary amplification" cascade, i.e., the optical transistor. Low-intensity optical signals can be used to control various functions of the device including re-tuning, optical signal selection, and channel switching. These control characteristics become possible due to the amplification of the optical signal at the very first stage of processing and due to the non-linear properties of the phase modulator, the optical transistor, and the ring optical transistor interconnected with the intrinsic or internal characteristics of these functional cells, i.e., the phase modulator, the optical transistor, and the ring optical transistor.

The above-described advantages and functional characteristics are implemented by the optical transistor, the ring resonator, and the configuration of the ring resonator with the electrically active optical bifurcation coupling (BOA) switch region.

The optical transistor basically allows the commutation/communication of optical signals with amplification of the optical signal or memorization of the optical signal as a function of the choice of the appropriate device characteristics and of the control signals applied to the electrodes. Optical transistor functions and characteristics are disclosed more fully in Lomashevich S. A., Bystrov Yu. L. "*Concept of Optical Transistor*" *Journal of Applied Spectroscopy*, 1991, t. 55, No. 3, pp. 485–490 and in USSR Inventor's Certificate No. 1225386, entitled "*Optical Transistor*" by Morozov, E. P, Lomashevich S. A., and Ryzhevnin, V. N.

In the present invention, the optical transistor (OT) is defined by two lasers and a waveguide (which is a phase modulator placed between the lasers) to constitute the first non-linear cascade of amplification operating in the optical bistability mode. When an optical signal enters the phase modulator of the optical transistor and the light intensity exceeds some threshold value (because, for example, an increase in laser radiation, adjustment of the phase modulator to resonance, or a change of refractive index due to a change of the electric field strength), then anti-reflection or saturation of the optical transistor takes place due to the non-linear properties of the material—tuning to the resonance. If the dependence $n = n_0 + n_2 I_p$ (where $n$ = the "dark" refractive index, $n_2$ = the non-linearity factor, and $I_p$ = the intensity in the resonator) is implemented, then upon attaining the threshold value of $I_p$ the influence of the addend becomes considerable, and the system automatically starts to tune toward and to resonance, this process arising in a rapid or avalanche-like manner and the characteristic being realized with large and substantial steepness to thus provide the desired amplification factor at the very beginning or first stage of the processing of the optical signal.

The optical transistor is also used as a coupling element with the ring resonator by means of (a) electrical tuning of the phase modulator or (b) a control optical signal being coupled to any part of the optical radiation from the phase modulator into the ring resonator, for example, an amplified optical signal can be picked-off at the output mirrors of the optical transistor for parallel processing in other optical circuits.

The phase modulator serves as in-resonator, non-linear Fabry-Perot interferometer optical path that depends on the intensity of integrated radiation. The phase modulator changes the optical length of the large resonator and also changes its Q-factor, which leads to the change of the threshold current. Such re-tuning allows the device to pass through the generation threshold, i.e., to obtain a lasing or laser mode.

According to the optical transistor concept, the first amplification cascade (i.e., the phase modulator) basically realizes the function of matching; without the requirement for strict coincidence of the input signal and resonator frequencies it allows to evoke such a response of the whole system so that under the influence of the input signal I, amplified in the phase modulator: $I = G_1 i$, and of the signal which has passed through the feedback circuit and has been amplified in the semiconductor laser amplifier (SLA); $I = G_{01} G_1 i$ the refractive index of the resonator of the optical transistor changes, which finally gives the below presented function of the optical transistor:

$$I = \frac{G_1 i}{1 + (\tau_1 I - \theta_{01})^2}, \quad (1)$$

where $\tau_1 = 1 + \dfrac{G_{01}}{1 + (I - \theta_{01})^2}$ is the optical transistor transmission characteristic $G_{01}$ — inner amplification gain factor of the optical transistor,
$G_1$ — gain factor for the phase modulator $G_1 = 3/(3 - \theta_1^2)$,
$\theta_{01}$ — phase angle for detuning of the optical transistor,
$\theta_1$ — phase angle for detuning of the phase modulator Additional disclosure relating to the optical transistor concept is disclosed in Lomashevich S. A., Bystrov Yu. L., "*Concept of Optical Transistor*" *Journal of Applied Spectroscopy*, 1991, t. 55, No. 3, pp. 485–490.

The ring resonator with its matching elements, i.e., directional couplers and active laser elements that simultaneously serve as semiconductor laser amplifiers (SLA), also represents an optical transistor (as disclosed in the above incorporated by reference U.S. Pat. No. 5,001,523) in which the relationship between the input optical signal i and the output optical signal I is described by the same formula (1), except for the change of the index "1" on index "2", but the gain factor G in the considered case reflects the transmission level from the electrically active optical bifurcation coupling (BOA) into the ring resonator.

The configuration of the ring resonator with the electrically active optical bifurcation coupling (BOA) switch provides for the new functional properties which are not found in each of these elements separately, i.e., the new properties which cannot be found in either the electrically active optical bifurcation coupling (BOA) switch or in the ring resonator. In the disclosed invention, the electrically active optical bifurcation coupling is a coupling element between the optical transistor (OT) and the ring optical transistor (rOT).

A study of optical bistability in commutators or switches of the electrically active optical bifurcation (BOA) type, which is a combination or unification of two single or one-mode optical waveguides into one two-mode waveguide in the coupling region, is described more fully in Andreev V. M., Verbitsky V. A., Lomashevich S. A., "*Optical Bistable Commutating Device with Electronic Feedback*", Tekhnicheski Sredstva Svyazi, seria: *Tekhn. Prov.* Svyazi, 1984, Vypusk 6, s. 115–121.

The calculation of parameters is based on decomposition of the input signal into natural modes of the mixer. Signals at the output of the mixer are the result of the interference of the mixer's modes having different propagation constants. Finally, it results in a relationship between the intensivities or intensities at the outputs $I_1(L)$ and $I_2(L)$ of the mixer with the length L and intensivity at the input $I_1(O)$, the dependence of the difference of the propagation constants on the amplification factor $G_{02}$ in the feedback circuit being $\Delta\beta = \Delta\beta_0 + G_{02}I_2(L)$, i.e., in the ring resonator:

$$I_1(L) = \frac{I_1(0)}{2d}(d + \cos(\Delta\beta L)), \quad (2)$$

$$I_2(L) = \frac{I_1(0)}{2d}(d - \cos(\Delta\beta L)),$$

where the parameter d characterizes the maximum allowable level of decoupling and is defined by the factors in decomposition.

In the case under consideration, the second equation is important: by transforming the second equation with the assumption $I_1(O)=i$ and $L=1$, the estimated gain factor $G_2$ from the electrically active optical bifurcation (BOA) into the ring resonator is:

$$\frac{i}{I} = G_2^{-1}(I) = \frac{d}{d - \cos(\Delta\beta)} \quad (3)$$

Combination of the gain factor of equation (3) with the optical transistor formula (1), supra, yields:

$$I = \frac{d}{d - \cos(G_{02}I + \Delta\beta_0)} * \frac{i}{1 + (\tau_2 I - \theta_{02})^2} \quad (4)$$

Considering the disclosed devices as a unitary or integrated assembly, the following dependence between the input intensity (i) and the output intensity (I) of the optical signal is shown by:

$$I = \frac{G_1-}{1 + (\tau_1 I - \theta_{01})^2} * \frac{d}{d - \cos(G_{02}I + \Delta\beta_0)} * \frac{i}{1 + (\tau_2 I - \theta_{02})^2} \quad (5)$$

where $$\tau_1 = 1 + \frac{G_{01}}{1 + (I - \theta_{01})^2} = \text{transmission of optical transistor}$$

and $$\tau_2 = 1 + \frac{G_{02}}{1 + (I - \theta_{02})^2} = \text{transmission of ring optical transistor}$$

The above presented formulae (1–5) define completely the functional abilities of the disclosed optical processor, as is apparent from the below-described graphical figures plotted in accordance with formula (5).

Other objects and further scope of applicability of the present invention will become apparent from the detailed description to follow, taken in conjunction with the accompanying drawings, in which like parts are designated by like reference characters.

DESCRIPTION OF THE PREFERRED EMBODIMENT

Figure 1:
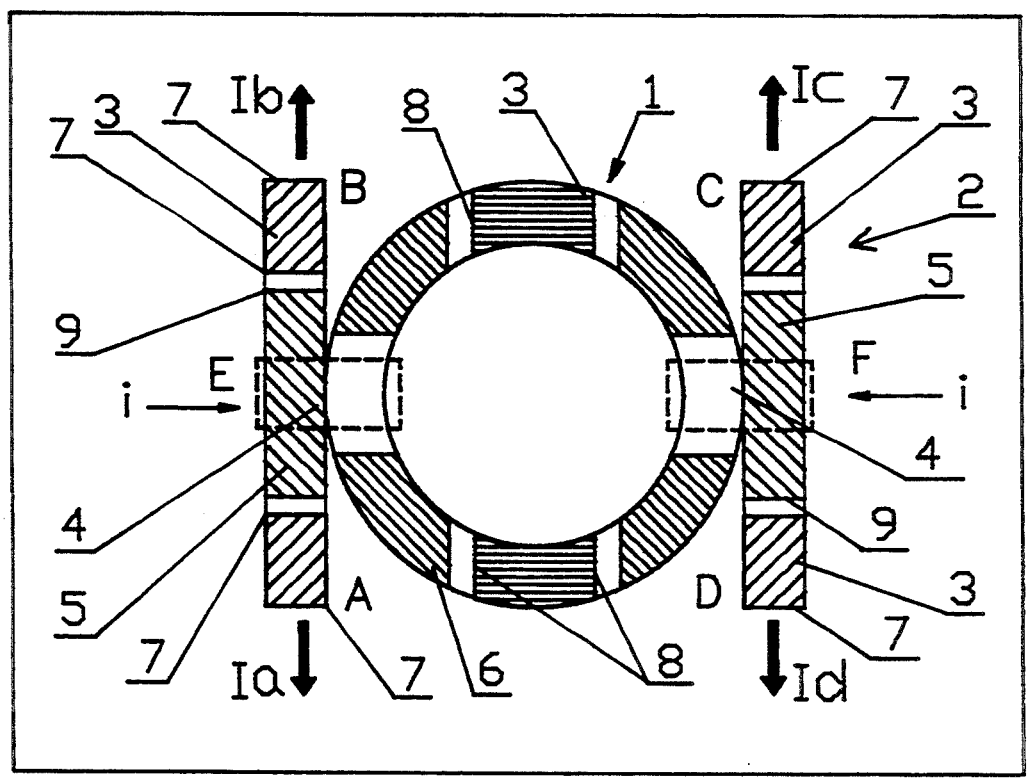
FIG. 1 is a plane view, in schematic fashion, of an optical processor in accordance with the present invention.

As shown in FIG. 1, an optical processor in accordance with the present invention is shown in schematic fashion and is designated generally by the reference character OP. As shown, the optical processor OP includes a non-linear ring resonator 1 having first and second lasers 3-1 and 3-2 in the optical path. The lasers 3-1 and 3-2 are each bounded by respective pairs of mirrors 8. A pair of waveguides, generally indicated by the reference character 2, are positioned adjacent opposite sides of the ring resonator 1. A waveguide 2-AB is positioned on the leftside of the ring resonator 1, and another waveguide 2-CD is positioned on the rightside of the ring resonator 1, opposite the first waveguide 2-AB. Lasers 3A and 3B are located at the terminal ends of the waveguide 2-AB and, in a similar manner, lasers 3C and 3D are located at the terminal ends of the waveguide 2-CD. The waveguides 2-AB and 2-CD are optically coupled at a position intermediate to their ends to the ring resonator 1 via electrically active optical bifurcation regions, designated generally by the reference character 4. Electrically active optical bifurcation coupling is disclosed in Papuchon et al, described above. The two lasers 3 of each of the waveguides 2 and a phase modulator, indicated generally at 5, and bounded by respective mirrors 9, constitute an optical transistor. Electrical contacts (discussed in more detail in relationship to FIG. 10, below) are formed on the top face over the lasers 3, the coupling regions 4, and selected portions of the ring resonator 1 intermediate of the coupling regions 4 and the lasers 3-1 and 3-2. In FIG. 1, those electrodes that are associated with the curvilinear sections of the ring resonator 1 are designated in general by the reference character 6. The input optical signal i is preferably input or enters the E and F regions of the phase modulator 5 or any of the optical ports or contacts the ends of the two waveguides, viz., ports A and/or B of the waveguide 2-AB or ports C and/or D of the waveguide 2-CD. Optical radiation is picked-off or removed from the outputs A, B, C, D as indicated by the values $I_a$, $I_b$, $I_c$, and $I_d$. The lasers 3 of the optical transistor are limited or bounded by mirrors 7, the lasers 3-1 and 3-2 of the ring resonator 1 are limited or bounded by mirrors 8, and, lastly, each phase modulator 5 is limited or bounded by mirrors 9.

FIGS. 2–9 illustrate the characteristics of the structure of FIG. 1 for various values of the parameters of formula (5), above, where "i"=input intensity, "I"=output intensity, and $I_0$=pumping intensity.

Figure 2:
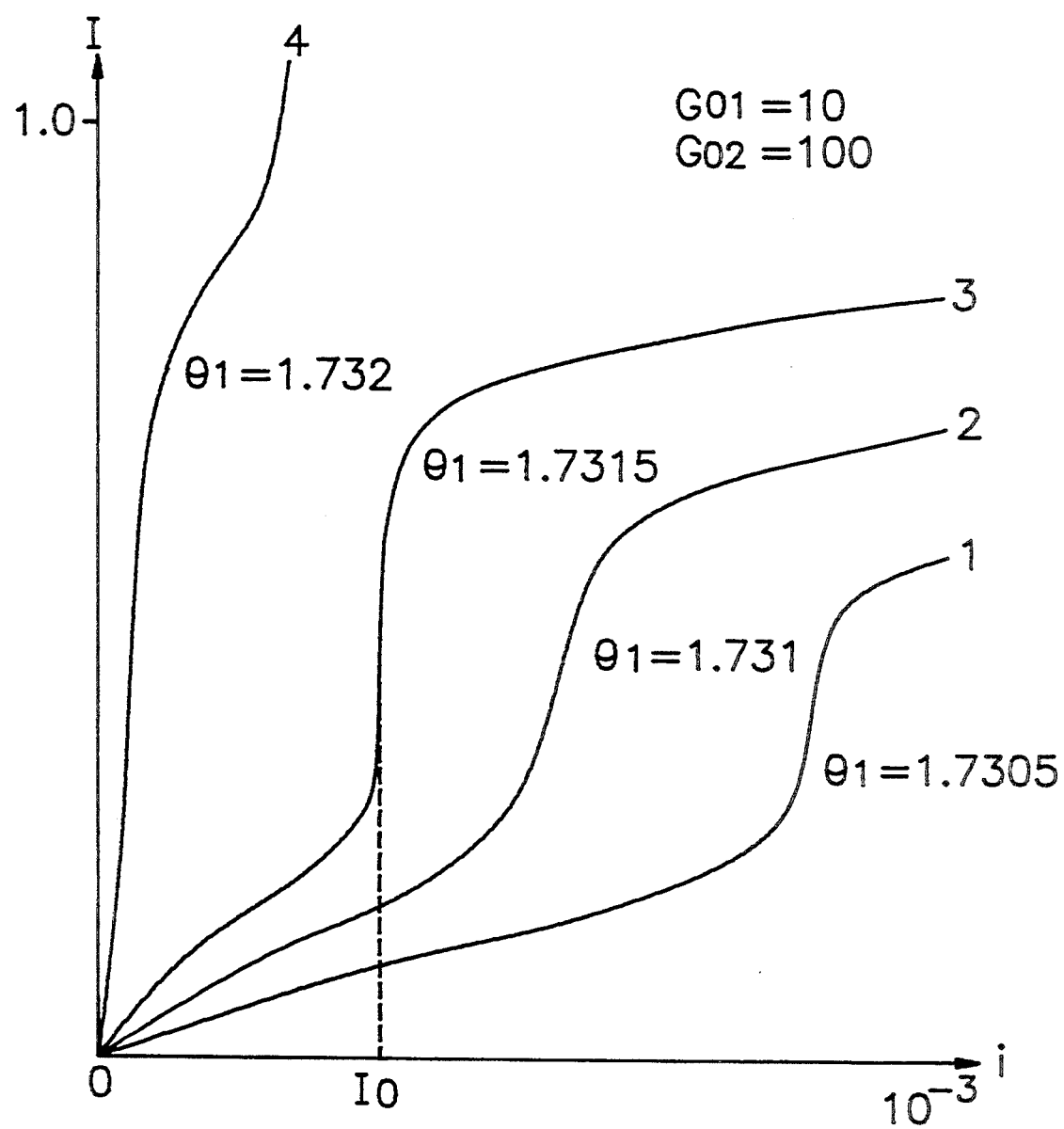
FIG. 2 is a graphical representation of the change in dynamic range and the threshold value $I_0$ of the differential amplification characteristic, where "i" (horizontal axis) is the input intensity, "I" (vertical axis) is the output intensity, and $I_0$ is the pumping intensity.

FIG. 2 illustrates output intensity I on the vertical axis and input intensity i on the horizontal axis with the pumping intensity $I_0$ shown to the right of the origin on the horizontal axis. FIG. 2 demonstrates the change of the dynamic range and threshold value $I_0$ of characteristics of differential amplification which are subordinate to the parameter $\theta_1$=initial detuning of the phase modulator. In FIG. 2, the four curves shown correspond to $\theta_1$ values of $\theta_1=1.732$, $\theta_1=1.7315$, $\theta_1=1.731$, and $\theta_1=1.7305$.

Figure 3:
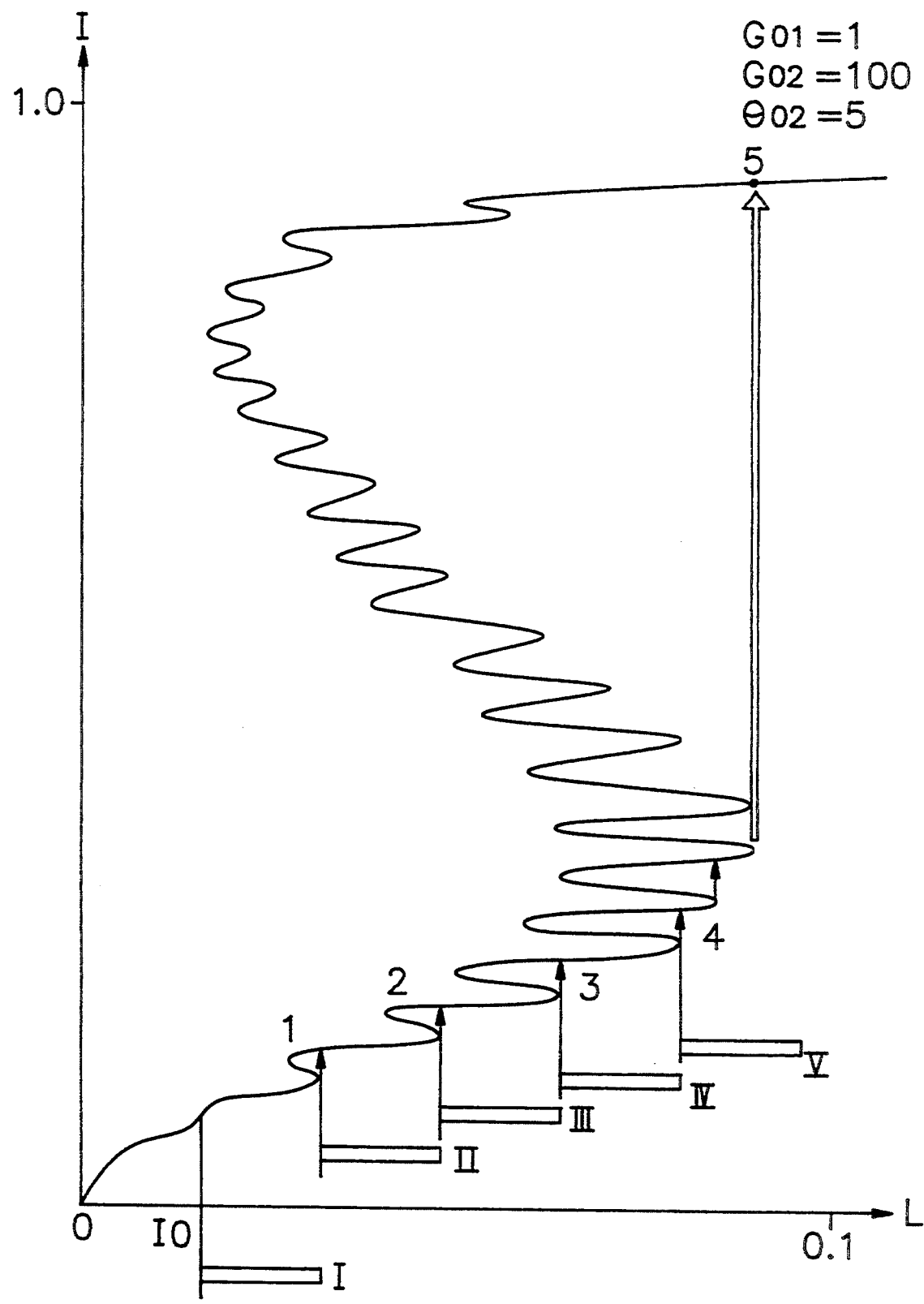
FIG. 3 is a graphical illustration of the calculation procedure for the value "5" stored in memory with values of the amplification parameters are shown in the graph.

FIG. 3 illustrates the calculation procedure with figure "5" value stored in memory. In FIG. 3, $G_{01}=1$, $G_{02}=100$, and $\theta_{02}=5$.

Figure 4:
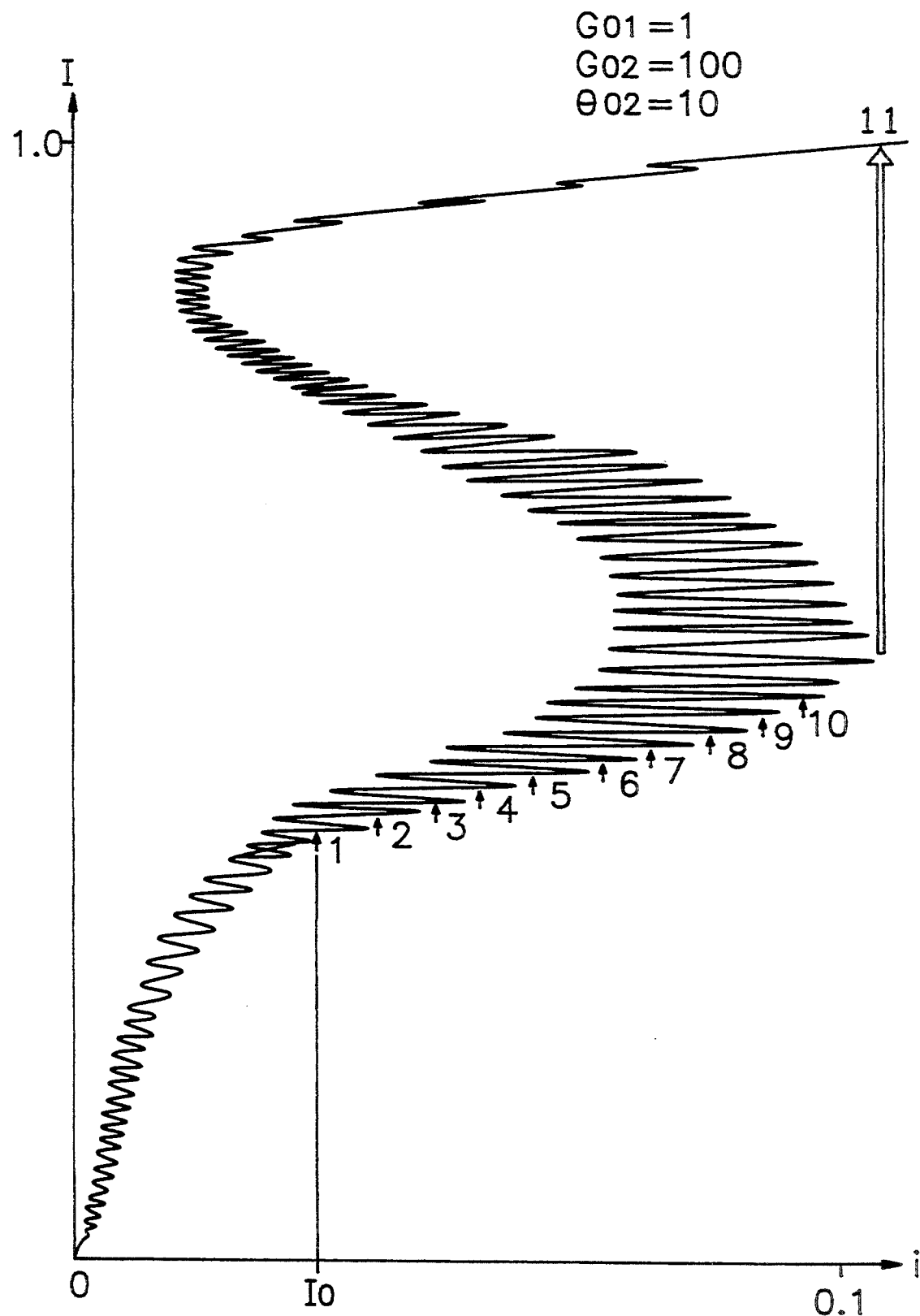
FIG. 4 graphically illustrates the capability of the optical processor to carry out computations using the multistable characteristics of the present invention.

FIG. 4 illustrates the ability of the processor to carry out computations using the multistable characteristics of the discloses optical device at $G_{01}=1$, $G_{02}=100$, (as in the case of FIG. 3) but with $\theta_{02}=10$ for taking the sum of 11 units. As compared with FIG. 3 in which the value 5 was accumulated, the "volume" or range of addition or adding has been expanded in FIG. 4, which is functionally connected or associated with the increase of the parameter $\theta_{02}$ from 5 to 10.

Figure 5:
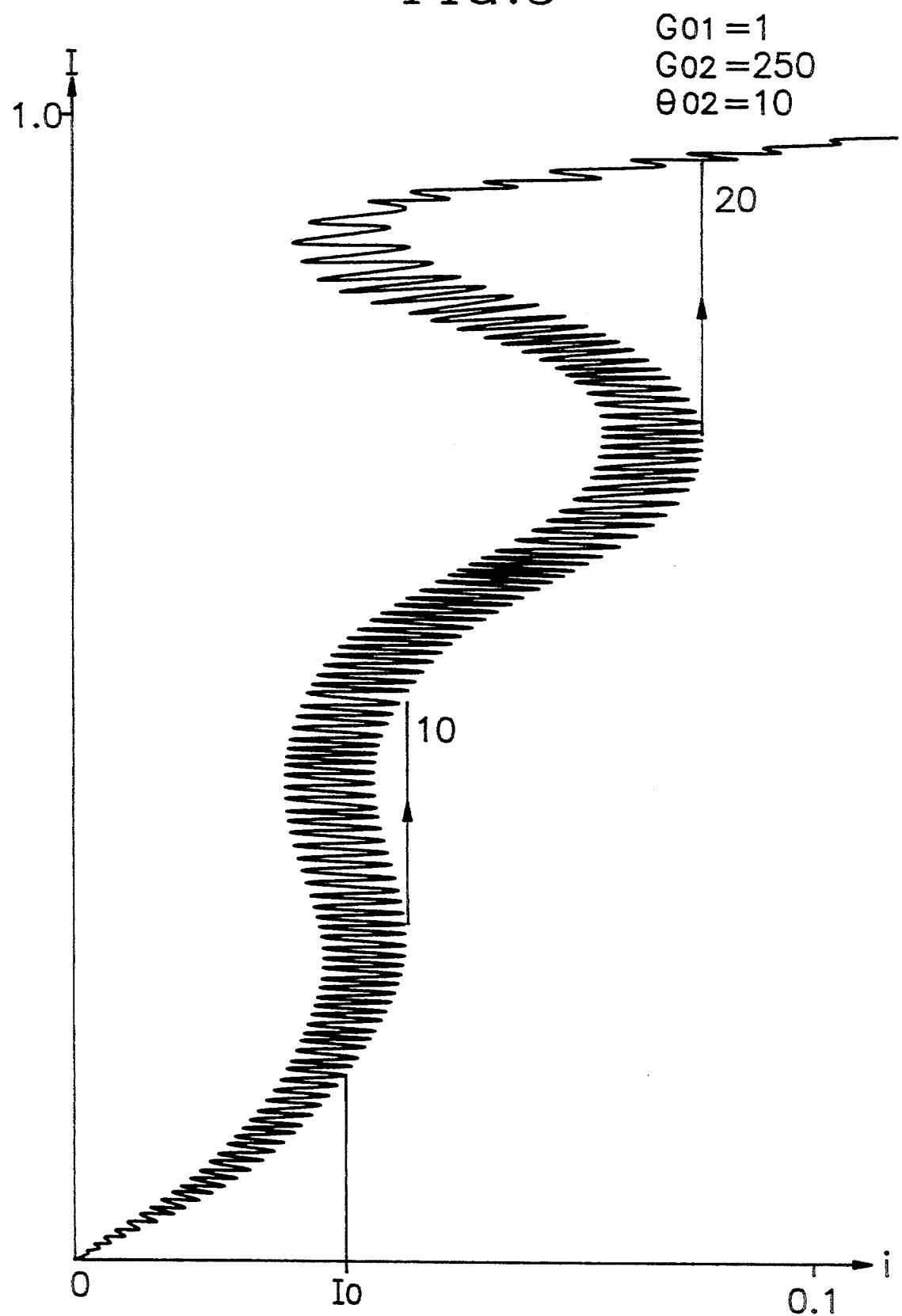
FIG. 5 graphically illustrates the procedure for accumulation or adding up to a total of 20 and the storage of this result.

FIG. 5 illustrates the procedure of adding up to 20 and the storage of this number. The capability for taking the sum of a larger number of units than shown in FIG. 4 is functionally connected or associated with increasing the $G_{02}$ factor up to a value of 250 from its value of 100 in FIG. 4. The capability of the optical processor to retain both numbers in memory is apparent.

Figure 6:
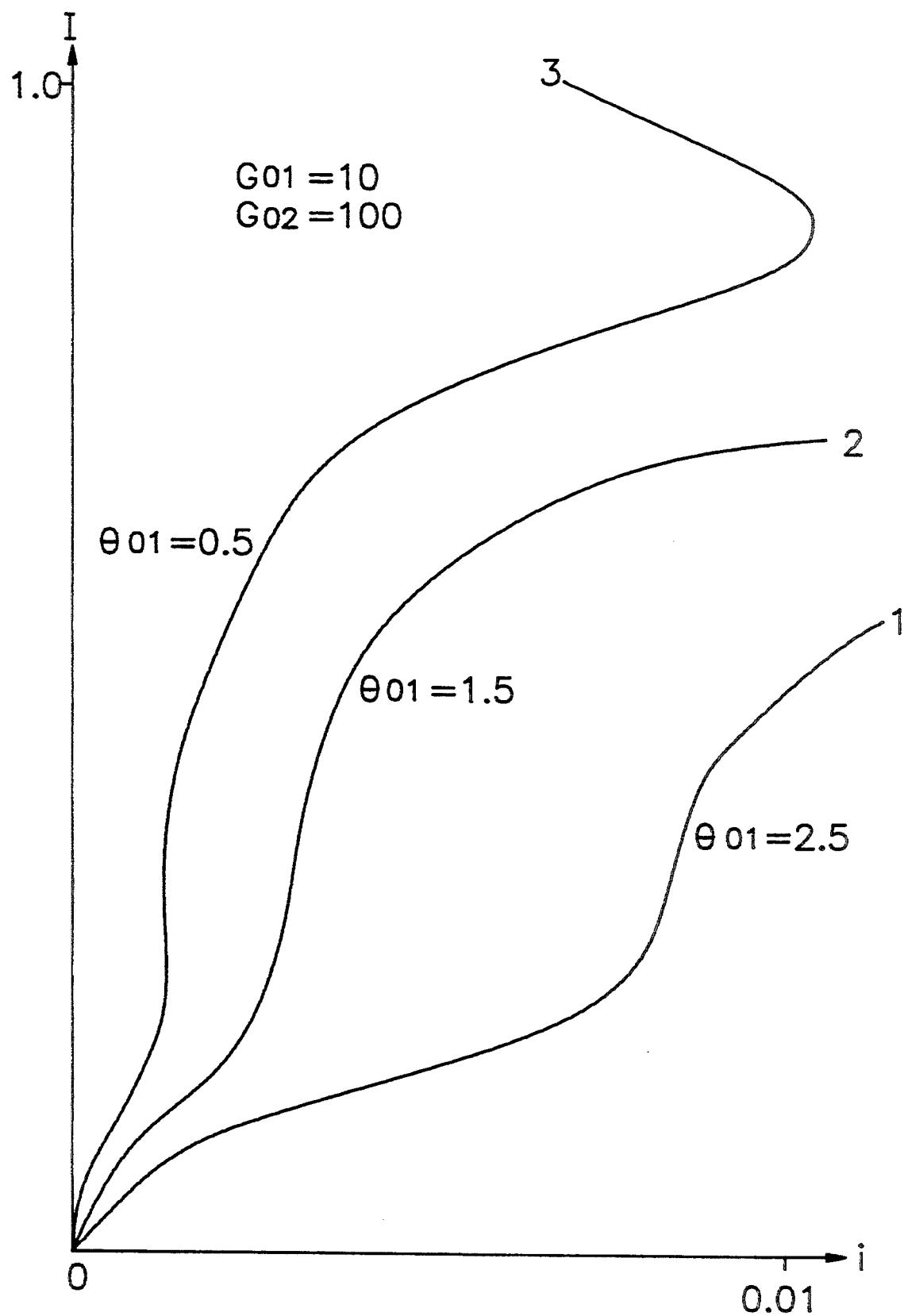
FIG. 6 graphically illustrates the influence of the initial detuning of the optical transistor.
Figure 7:
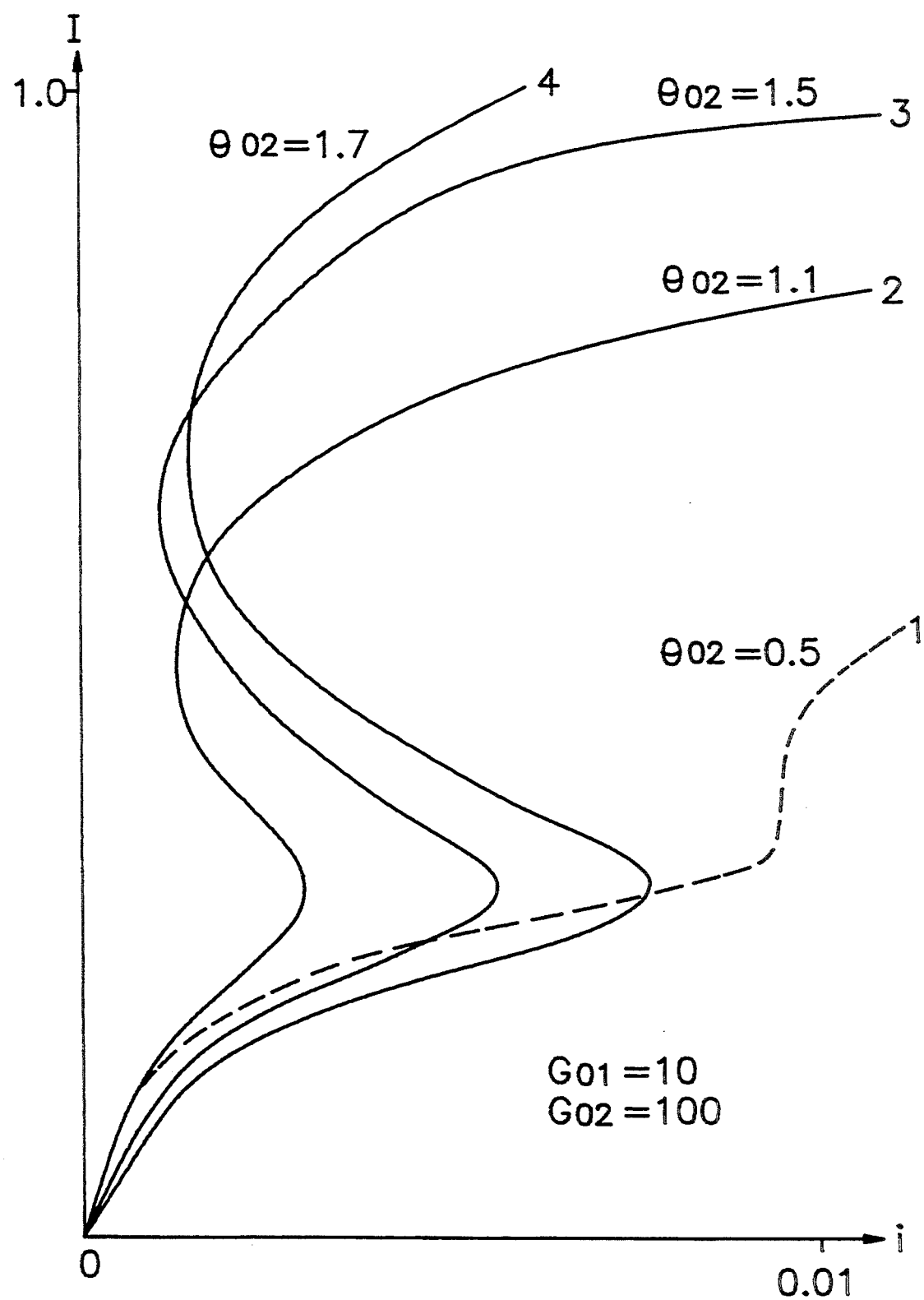
FIG. 7 graphically illustrates the influence of the initial detuning of $\theta_{02}$.
Figure 8:
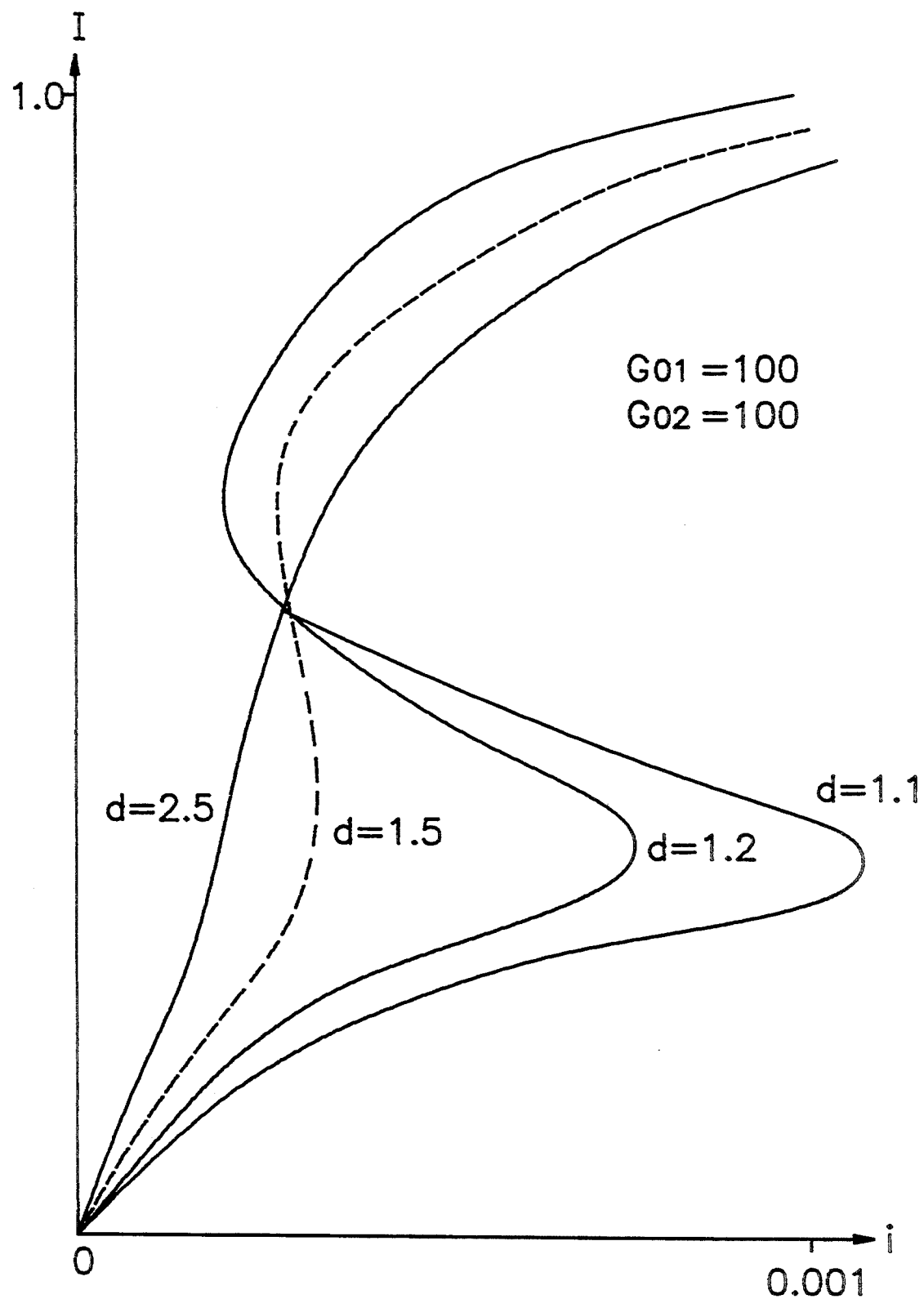
FIG. 8 graphically illustrates the change in the characteristic of the optical histability as a function of an increasing d factor.
Figure 9:
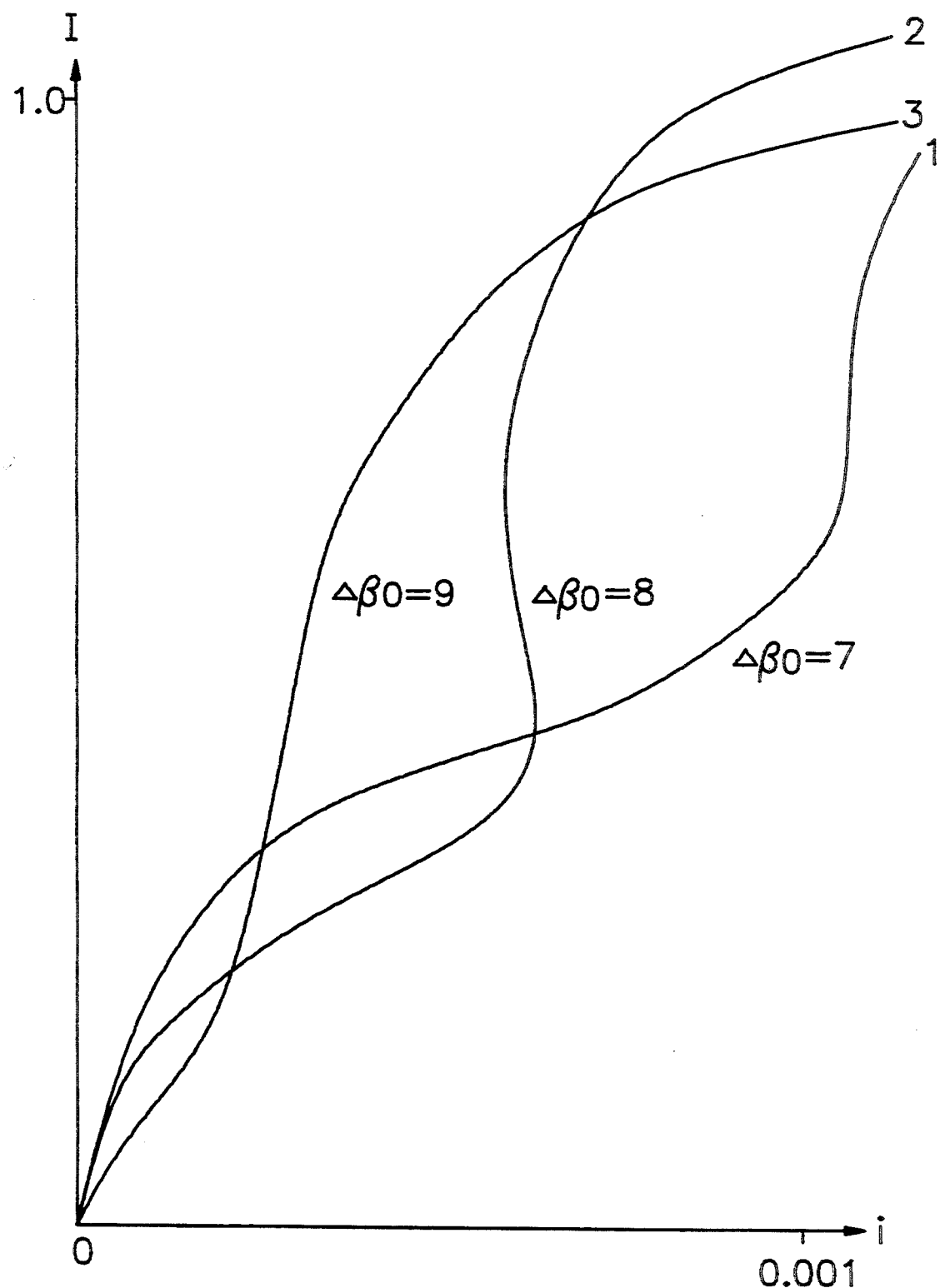
FIG. 9 graphically illustrates the dependence of the curves on the phase difference of mode propagation.

FIGS. 2 and 6–9 refer to the initial part of characteristics and they show the influence of various parameters on the form of the characteristics and their arrangements. FIG. 6 illustrates the influence of the initial detuning of the optical transistor for $\theta_{01}=0.5$, $\theta_{01}=1.5$, and $\theta_{01}=2.5$. FIG. 7 illustrates the influence of the initial detuning of $\theta_{02}$ for $\theta_{02}=0.5$, $\theta_{02}=1.1$, $\theta_{02}=1.5$, and $\theta_{02}=1.7$ with $G_{01}=10$ and $G_{02}=100$. FIG. 8 illustrates the change in the optical bistability characteristic as a function of an increased d factor with $d=1.1$, $d=1.2$, $d=1.5$, and $d=2.5$ (and with $G_{01}$ and $G_{02}$ having the same value, i.e., $G_{01}=100$ and $G_{02}=100$). In FIG. 9, the dependence of the curves on the phase difference of mode propagation can been seen for various values of $\Delta\beta_0$ including $\Delta\beta_0=7$, $\Delta\beta_0=8$, and $\Delta\beta_0=9$.

Figure 10:
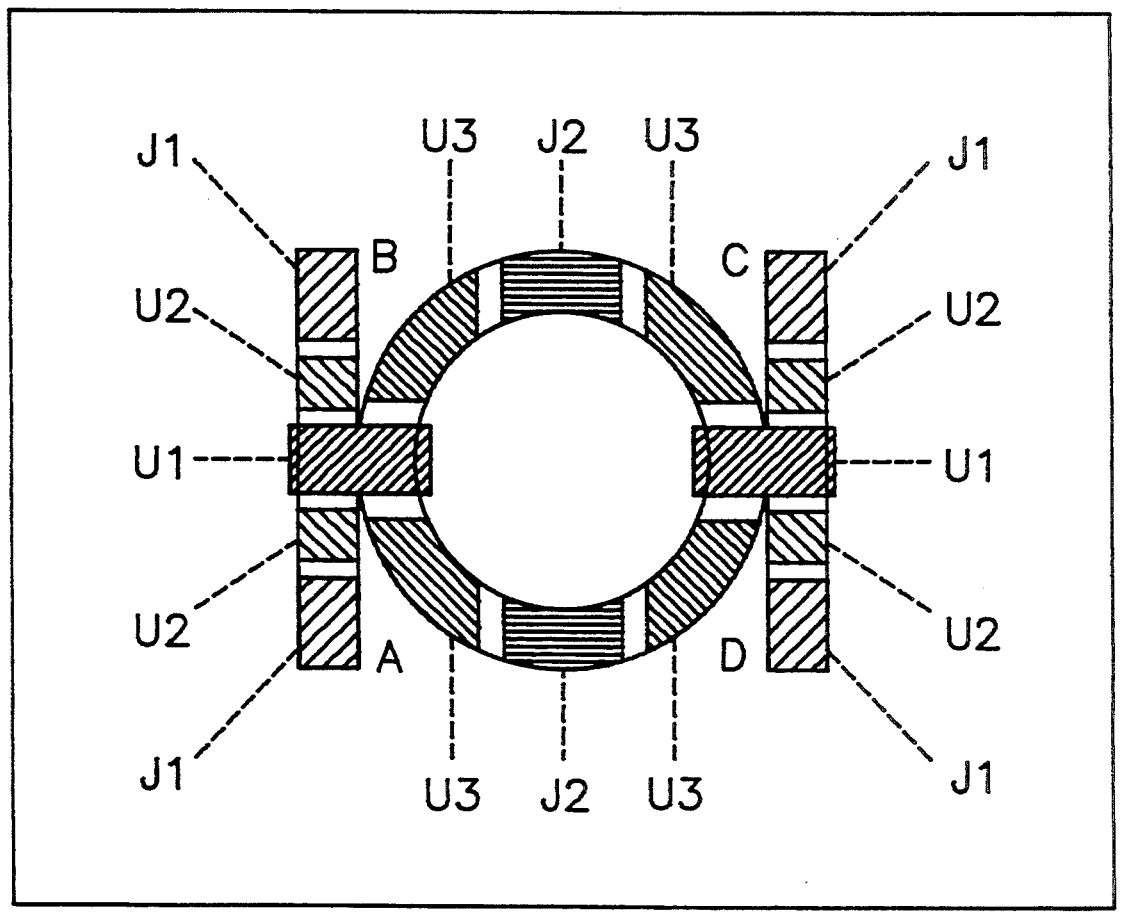
FIG. 10 illustrates the optical contacts and their corresponding electrodes for the device of FIG. 1.

FIG. 10 shows the contacts and their corresponding electrodes with the symbol "J" representing current-carrying electrodes and the symbol "U" representing voltage-carrying electrodes. As shown, current-carrying electrodes J3-1 and J3-2 overlie the lasers 3-1 and 3-2 of the ring resonator 1 and voltage-carrying electrodes U4-1 and U4-2 overlie the coupling regions 4 between the ring resonator 1 and the first waveguide 2-AB and the second waveguide 2-CD. Voltage-carrying electrodes U6-1, U6-2, U6-3, and U6-4 overlie those sections of the ring resonator 1 intermediate the two lasers 3-1 and 3-2 and the coupling regions 4 beneath electrodes 4-1 and 4-2. Current-carrying electrodes are positioned at the terminal ends of each waveguide 2-AB and 2-CD and are designed as J-A and J-B for the waveguide 2-AB and as J-C and J-D for the waveguide 2-CD. Lastly, electrodes for controlling the phase modulator 5 are mounted on each waveguide intermediate the electrodes at the terminal ends of the two waveguides and the electrodes 4-1 and 4-2 that control the coupling regions. The phase modulation control electrodes are designed as U5-A, U5-B, US-C, and US-D in FIG. 10. In FIG. 10, $J_1$ represents the optical transistor laser pumping current, and $J_2$ represents the ring optical transistor laser pumping current. Voltage $U_1$ effects control of the electrically active optical bifurcation (BOA) coupling and of the refractory indices of the waveguides located under the electrode 4 of FIG. 1. Voltage $U_2$ controls detuning of the phase modulator, and voltage $U_3$ controls detuning of the ring resonator.

The effect of optical bistability (OB) manifests itself in non-linear media in which the index of refraction is a function of and is dependent upon the intensity (i.e., the intensivity) of the optical energy in the media, $n=n_0+n_2I_p$, and at the feedback present in the system. In the disclosed device, both the optical system as a whole (made of one and the same material with dispersive, or absorptive, non-linearity and ring resonator-operated feedback) as well as its individual elements (i.e., the linear optical transistors A-B and C-D, the ring optical transistor, in which feedback is provided by the outer mirrors or by the ring resonator, respectively) meet the said requirements. See also Bystrov, Yu. L., Lomashevich, S. A., Svetikov, Yu. V. "*Optical Transistor as a New Functional Element of VOSP Technique*" Elektrosvyazj, 1992, No. 1, pp. 22–25. It is critical for the operation of the disclosed device that the initial response of the system to the input radiation, taking place in the input optical transistor, occurs in accordance with stalling, and, consequently, rapidly in time (on the order of picoseconds), and with very steep characteristics. Further, formation of the output signal is also effected by the system operating in the optical bistability mode. The preliminary amplification, amplification, power amplification sequence is a simplified way to characterize the successive formation of the output signal in the system. The ring resonator 1, being in optical contact with both waveguides 2-AB and 2-CD (i.e., with the optical transistor) at a strong coupling level, pumps optical energy into itself, thus smoothing non-regular or non-periodic fluctuations associated with the separate waveguides and, vice versa, enlarging the effects, peculiar to the system and defined by the parameters which enable it to change the form of the characteristics and output data of the optical processor.

From the formula (5), above, which functionally interrelates or connects the input intensity i and the output intensity I of the optical signals, it follows that the seven parameters, i.e., $G_1=3/(3-\theta^2_1)$, $G_{01}$, $G_{02}$, $\theta_{01}$, $\theta_{02}$, d, and $\Delta\beta_0$ in principle are able to change the properties of the optical processor or to influence its characteristics.

The parameter $G_1$ is the gain factor of the phase modulator; it is a function of and depends on the initial detuning of $\theta_1$ of the inner resonator optical transistor and is changed by the voltage applied to the electrode of the phase modulator. The parameter $G_1$ influences the responsivity threshold and the dynamic range of the characteristic (FIG. 2): with $\theta_1$ increasing, i.e., when $\theta_1$ approaches and converges towards at the limiting value of the square root of 3 ($\sqrt{3}$), the pumping intensity $I_0$ decreases.

The parameter $G_{01}$ is the optical transistor inner or intrinsic amplification factor. In the disclosed device, the influence of the parameter $G_{01}$ is not so strong as in the case of a "pure" optical transistor. It is only at large changes of $G_{01}$ that a decrease of the threshold value of the optical bistability $I_0$ and transformation of characteristics occur. The change in $G_{01}$ the using laser pumping current $J_1$ or the voltage $U_2$ at the phase modulator for control allows for the fine adjustment of the optical transistor, i.e., the first cascade of the optical signal processing sequence.

The parameter $G_{02}$ is the intrinsic or inner amplification factor of the ring optical transistor and of the feedback circuit of the optical histability cell, formed by the electrically active optical bifurcation coupling (BOA) and the ring resonator. The parameter $G_{02}$ has bistability arms for $i=f(I)$ as shown in FIGS. 3–5 and increases together with the laser pumping current in the ring resonator and the voltage $U_S$ on the electrodes of the ring resonator (for tuning of ring resonator to the resonance). With increasing $G_{02}$, the responsivity of the entire system increases.

The parameter $\theta_{01}$ is the value of the optical transistor initial detuning. The influence characteristic imposed upon the output parameters is the same as with $\theta_1$ (FIG. 6), since both of these parameters finally change the tuning of the optical resonator optical transistor. The influence grade of $\theta_1$ is less than that of $\theta_1$ due to the absence of the limit value (FIG. 6), that is why $\theta_1$ changes in a broader range and has a wide range of possibilities to smoothly change the characteristics and the output parameters of the device. Adjustment is effected by changing the current values $J_1$ in the lasers 3 in the waveguides A, B, C, D and/or by changing voltage $U_2$ on the control electrodes of the phase modulator.

The parameter $\theta_1$ is the value of the initial detuning of the ring optical transistor and of the whole system; $\theta_{02}$ is the factor defining the resonance state and characterizes the sharpness of the resonance of the optical processor. $\theta_{02}$ changes over a wide range and influences multistability. Together with the d-factor, $\theta_1$ monitors the form of the device characteristics, the area of the hysteresis loop, and the level of optical pumping $I_0$. $\theta_{02}$ is specified when manufacturing the device and is changed and controlled by the voltage $U_3$ on the electrodes of the ring resonators and by the injection level in the ring optical transistor lasers, i.e., by the $J_2$ currents.

The parameter d is the factor that defines the level of gating in the neighboring channel in the electrically active optical bifurcation coupling (BOA) configuration; it is the most important parameter of any switching or commutating device; $d=(c_1^4+c_2^4)/c_1^2c_2^2$, where $c_1$ and $c_2$ are factors in the decomposition of the wave profile into the mixer's modes. For additional disclosure as to these factors, see Andreev, V. M., Verbitsky, V. A., Lomashevich, S. A. "*Optical Bistable Commutating Device With Electronic Feedback*" Teknicheskie Sredstva Svyazi, seria: *Tekhn. Prov.* Svyazi, 1984, Vypusk 6, s. 115–121. In the disclosed device, the d-factor determines its behavior as a whole: the form of its characteristics and the area and width of its hysteresis (FIG. 8). The unit value (1) is the limiting value, and, in the range close to d=unity, the system displays optical bistability with a wide hysteresis at any values of the other parameters, which, for d approaching unity (d→1), can only alter the hysteresis loop but cannot transform it into the differential gain curve. The d-factor is controlled by the voltage on the BOA electrodes; large d values (d>5) result in a steady characteristic of the differential gain. Thus, there are ranges of values of the d-factor, for which either the hysteresis cycle (memory) or the differential gain curve are steadily realized. It turns out critical that the tuning insignificantly affects the whole system, since changes of the refractive index occur only in the BOA region, while the effect manifests itself over the whole system with other parameters being fixed at the moment, i.e., the d-factor is weakly connected with the other parameters.

The parameter $\Delta\beta_0$ is the difference of the constants of the mode propagation in the waveguides and in the mixer and basically allows with its increase to decrease the pumping level value (increases sensitivity), the form of characteristic being unchanged. $\Delta\beta_0$ is controlled by the voltage on the electrodes of the waveguides and of the electrically active optical bifurcation coupling (BOA), i.e., by the values $U_1$ and $U_2$ (FIGS. 9, 10).

It should be noted, that the manifestation of optical bistability in the system for d and $\Delta\beta_0$ other than zero testifies to the possibility of realization of these characteristics in real systems, in which neither strict coincidence of mode phases for specified cross-sections nor an absolute channel isolation are possible. The relationship between applied voltages and/or currents for the above described parameters is summarized in Table I in which the leftmost column presents the parameter, the rightmost column presents the voltage variable (U), and the center column presents the current variable (J).

TABLE I

| Controlled Parameter | Current (J) | Voltage (U) |
|---|---|---|
| $G_1$ | | $U_1$ |
| $G_{01}$ | $J_1$ | |
| $G_{02}$ | $J_2$ | |
| $\theta_{01}$ | $J_1$ | $U_1 U_2$ |
| $\theta_{02}$ | $J_2$ | $U_3$ |
| d | | $U_1$ |
| $\Delta\beta_0$ | | $U_1$ |

In order to operate the disclosed device, current values $J_1$ and $J_2$ (FIGS. 1, 10) are chosen for the various lasers so that the intensity of optical radiation in the ring resonator, which is in fact the resonator of the system as a whole, does not exceed some threshold value of the intensity of the non-linear effect in the ring resonator material. Initially the resonator is in the state of detuning to the resonance, this being "the lowest" state of the output intensity. When light intensity exceeds some threshold value (i.e., because of an increase in laser radiation, adjustment of the phase modulator to resonance, or a change of the refractive index due to a change of the electric field strength in the region of the phase modulator and in the ring resonator), then antireflection or saturation of the phase modulator and of the ring resonator takes place due to the non-linear properties of the material, i.e., tuning toward and to resonance. If the dependence $n=n_0+n_2I_p$ is implemented, then upon attaining the threshold value of $I_p$, the influence of the addend becomes considerable, and the system automatically starts to tune toward resonance, this process proceeding in a rapid and avalanche-like manner due to the high Q-factor of the ring resonator and the feedback in the optical transistor (provided by the mirrors) and in the BOA-switch (due to the strong links between the oscillation modes and a high G-factor in the feedback circuit). The radiation changes its optical length nL (L is length of the circumference of the ring resonator or distance between mirrors A-B, C-D) in the direction of resonance; the inner field $I_p$ increases which, in turn, causes still greater change of the refractive index, increases nL, and the system quickly moves toward and to the resonance state. During this process, an increase of $I_p$ results in an increase of the optical field in the lasers due to the light injection, a decrease of carrier density, an increase of the refractive index in the active region of the lasers which upsets the laser into the mode of stimulated radiation, which, in turn, causes still greater enlargement of the power of the light field in the system.

In the initial state, the Fabry-Perot interferometer and the ring resonator are detuned, and the integrated power of the lasers is not enough to exceed the threshold for causing non-linear effects, while the value of the outer optical signal, amplified in the optical transistor and in the coupling region (FIG. 1) at the optical bistability cascade of the coupled modes, turns out to be enough to cause the above-described process of the changing of properties of the ring resonator and the system as a whole which finally results in a transition of the system into the "highest" light-intensity state. It should be noted that, since the array waveguide-ring resonator is optically bistable and has feedback through the ring resonator, the pumping of the energy of the input signal, that is why from the very beginning of the system response (to the input disturbance) formation of the output signal is determined by stalling and highly steep characteristics, closed into a self-matching cycle: bistable stalling of the signal causes sharp increases of the intensity in the ring resonator and in the other cells of the device causing the above described consequences, but this increase of intensity is recognized by the cell waveguide-resonator as an increase in pumping intensity, i.e., as an event which still speeds up an upset into the "highest" state. Because of the strengthening of the optical coupling of the cell waveguide-resonator due to the change of the refractive index (since it is the value of "n" in the BOA region that determines the factor and the coupling degree of modes) the effect turns to be self-sustaining and accelerates or speeds up in the direction of the increase of the in-resonator intensity.

The disclosed device can be used as a storage location or as an optical "triod" by appropriate control of its operating characteristics. The initial part of the characteristics in the region of high sensitivity is used in the considered case (FIGS. 2, 6–9); retuning is effected by the electrical adjustments through the electrodes, i.e., by changing the electric field in the optical transistor and the ring resonator, or by controlling the current values in the lasers as presented in Table I, above.

The "sharp" character of the increase of the light power accounts for high values of the amplification factor, viz., up to 40 dB. In devices with stalling mechanisms of operation, the real steepness of the characteristic is limited by the fundamental processes, i.e., relaxation of the medium (with time of the order of $10^{-12}$ to $10^{-13}$ seconds), dissipation of energy, fluctuations of the optical field in the resonator, plus imperfections present in real resonators.

Implementation of the "processor" mode is achieved by working in the multi-stability region of the curves of FIGS. 3–5 with corresponding values of the parameters.

Thus, the input optical signal i, entering either the E or F optical port or contact, causes anti-reflection or saturation of the phase modulator, as limited by the mirrors 9, of the optical transistor, tuning of the phase modulator to the resonance state, and, as a consequence, tuning to the resonance of the optical transistor, an increase of the radiation of the lasers of the optical transistor, an increase of the optical field in the region of the optical transistor and the electrically active optical bifurcation (BOA), pumping of energy in the ring resonator in both directions (clockwise and counterclockwise), which finally initiates non-linear effects in the ring resonator medium, retuning to the resonance of the ring resonator, switching of the ring optical transistor lasers into the laser generation mode, amplification of the optical signal being generated into $G_{02}$ times the pre-amplification value; then a still greater increase of the optical field in the ring resonator follows, this disturbance via feedback circuit goes back to the BOA and the optical transistor, and so on, the sequence of events continuing to recur. As a result, an amplified signal I is radiated at any of the output ports A, B, C, D.

In the computing mode (FIGS. 3–5), storage of the input impulses takes place with preliminary amplification of the optical transistor continuing up to the moment when the system goes to the next light intensity state or grade.

Representative materials used for manufacture of the disclosed device include three-component systems (for example, GaAlAs) and four-component systems (for example, InGaAsP), solid solutions, compositions of which depend on the range of overlaying wavelengths of optical radiation. Technical processes for fabrication of the optical processor include liquid, gas-phase, moshydrate and molecular-beam epitaxy.

Design and structures of the active cells of the optical processor in its combined (hybrid) version are manufactured using the above mentioned technological processes and then are installed into etched windows in the ring resonator and waveguides using In-based solder.

As to the integrated-optical version, the following structures are proposed. Lasers on the double heterostructure; the most simple variant is implemented by generation of an active layer distributed over the ring resonator and waveguides. Vertical formation of the active layer occurs together with the heterostructure growth; planar-wise the active layer is limited by the size of contact pads, which repeat the form of the elements of the processor. Alternatively, the limitation can be implemented by manufacturing a narrow active layer in an immersed masked heterostructure. In the integrated-optical version, mirrors are manufactured in the form of distributed feedback (DFB) or the like distributed Bragg mirrors (DBM) using the process of holographic lithography accompanied by chemical etching. The above considered designs can be ,implemented using quantum-sized structures.

There are many advantages of the disclosed device. The possibility of carrying out logical operations and computations with optical impulses and to effect storage in a multilevel mode. The possibility of controlling various functions of the optical processor using parameters determined by the dependent relationship i=f(I) and desirably subordinated to electric control via the electrodes of the device. The manner by which input optical signals are introduced into the phase modulator of the optical transistor avoids the strict coincidence of optical signal frequencies and tuning frequencies of optical transistor. A high amplification factor (above 40 dB), high responsivity, and suppression of non-regular fluctuations are achieved. Full accessibility and four optical outputs and, lastly, the possibility of commutating or switching optical signals with amplification are likewise achieved.

As will be apparent to those skilled in the art, various changes and modifications may be made to the illustrated optical processor of the present invention without departing from the spirit and scope of the invention as determined in the appended claims and their legal equivalent.

What is claimed is:

1. An optical processor, comprising:
   a non-linear ring resonator;
   at least one pair of strip waveguides, said ring resonator and said pair of strip waveguides disposed on a common substrate, each of said waveguides having a region of optical coupling with said nonlinear ring resonator and each of said waveguides having a semiconductor laser at each opposite end portion thereof;
   at least a first semiconductor laser and a second semiconductor laser positioned in said nonlinear ring resonator in regions thereof outside of said regions of optical coupling; and
   control electrodes located at said regions of optical coupling and located on said ring resonator intermediate to said first and second semiconductor lasers and said regions of optical coupling.

2. An optical processor, as claimed in claim 1, wherein
   each of said waveguides has a phase modulator.

3. An optical processor, as claimed in claim 1, wherein
   said at least one pair of waveguides is one pair of waveguides.

4. An optical processor, as claimed in claim 1, wherein
   a first semiconductor laser and a second semiconductor laser are positioned in said nonlinear ring resonator in regions thereof outside of said regions of optical coupling.

5. An optical processor, as claimed in claim 1, wherein
   said semiconductor lasers on said pair of waveguides are both an input port for input optical signals and an output port for optical radiation.

* * * * *